United States Patent

Makinouchi

[11] Patent Number: 5,877,845
[45] Date of Patent: Mar. 2, 1999

[54] SCANNING EXPOSURE APPARATUS AND METHOD

[76] Inventor: Susumu Makinouchi, c/o Nikon Corporation (Intellectual Property Headquarters)Fuji Building, 2-3 Marunouchi 3-chome, Chiyodu-ku, Tokyo, Japan

[21] Appl. No.: 896,128

[22] Filed: Jul. 17, 1997

Related U.S. Application Data

[63] Continuation-in-part of Ser. No. 864,526, May 28, 1997.

[30] Foreign Application Priority Data

Jul. 18, 1996 [JP] Japan .................................... 8-189153

[51] Int. Cl.$^6$ .................................................. G03D 27/53
[52] U.S. Cl. ............................. 355/53; 250/548; 356/400
[58] Field of Search .................................. 355/43–45, 53, 355/55, 67, 77; 250/548, 559.37; 356/398–401

[56] References Cited

U.S. PATENT DOCUMENTS

| | | | |
|---|---|---|---|
| 5,477,304 | 12/1995 | Nishi | 355/53 |
| 5,646,413 | 7/1997 | Nishi | 250/548 |
| 5,737,063 | 4/1998 | Miyachi | 355/53 |

FOREIGN PATENT DOCUMENTS 62-277503 A  12/1987  Japan .
62-277504 A  12/1987  Japan .

*Primary Examiner*—D. Rutledge
*Attorney, Agent, or Firm*—Morgan, Lewis & Bockius LLP

[57] ABSTRACT

A scanning exposure apparatus for scan-exposing the image of a mask pattern on a mask onto a substrate by synchronously moving the mask and the substrate with respect to an exposing radiation flux is provided. The scanning exposure apparatus includes a movable mask stage for holding the mask, a movable substrate stage for holding the substrate, a first detector outputting a first signal indicating the position of the substrate stage, and a second detector outputting a second signal indicating the position of the mask stage. The scanning exposure apparatus further includes a controller processing the first signal to derive a target position of the mask stage, the controller receiving the second signal to derive a deviation of the mask stage from the target position, the controller further deriving an error anticipation signal in accordance with deviations in mask stage movement measured in advance of scan-exposure, and a mask stage controller for moving the mask stage in accordance with the derived deviation of the mask stage from the target position and the error anticipation signal to maintain the position of the mask stage to the target position.

19 Claims, 4 Drawing Sheets

SCANNING EXPOSURE APPARATUS AND METHOD

CROSS REFERENCE TO RELATED APPLICATION

This application is a continuation-in-part of U.S. patent application No. 08/864,526 entitled "SCANNING EXPOSURE APPARATUS AND METHOD", filed on May 28, 1997, the content of which is relied upon and incorporated by reference.

This application claims the benefit of Japanese application No. 08-189153, filed on Jul. 18, 1996, which is hereby incorporated by reference.

BACKGROUND OF THE INVENTION

1. Field of the Invention

The present invention relates to an exposure apparatus for projecting a mask pattern onto a photosensitive substrate in photolithography processes in the manufacture of semiconductor devices, image pickup devices (CCDs), liquid crystal display devices, and thin film magnetic heads, etc. More specifically, the present invention relates to a scanning type exposure apparatus, such as a projection exposure apparatus of a step-and-scan system, which synchronously scans a mask and a photosensitive substrate using a projection optical system.

2. Discussion of the Related Art

In the manufacture of semiconductor devices, for example, a reduction projection type exposure apparatus (stepper) of step-and-repeat type (one-time exposure type) has often been used to transcribe a pattern on a mask (reticle) onto each shot region of a wafer coated with a photoresist. However, in response to the recent demand for transcribing circuit patterns on a larger area with higher accuracy without placing a heavy burden on the projection optical system, a so-called step-and-scan type projection exposure apparatus has been developed. The step-and-scan type projection exposure apparatus successively transcribes the image of the pattern on the reticle onto each shot region on the wafer by synchronously moving (scanning) the reticle and the wafer with respect to the projection optical system in such a way that a portion of the pattern on the reticle is successively projected on a wafer via the projection optical system.

The previously known aligner, which transfers the entire pattern of the reticle onto the entire wafer with a positive image of equal magnification by a single exposure operation using a single body type stage, is a prototype of the scanning type exposure apparatus. In contrast, in the step-and-scan system, since a reduction-type projection optical system is normally used, it is necessary to drive the reticle stage and wafer stage independently at a speed ratio proportional to the reduction ratio of the projection optical system. Also, since movement between shot regions is performed in a stepping mode, the mechanism of the stage system is complex and requires an extremely high level of control.

The following is one example of a method for controlling the stage system in a conventional projection exposure apparatus of step-and-scan type. After aligning the reticle stage with the wafer stage at the beginning of scanning, the wafer stage and the reticle stage are synchronously moved (scanned) at a predetermined respective speeds in predetermined directions. During such scanning operation, the positional deviations in the scanning direction and non-scanning direction (direction perpendicular to the scanning direction) of both stages are monitored using laser interferometers and the positional deviations thus measured are offset by a servo control system. In other words, in the conventional method, these positional deviations are corrected by feeding back the measured positional deviations in a closed feedback loop.

As described above, in the conventional step-and-scan type projection exposure apparatus, the positional deviations in the scanning direction and non-scanning direction of the reticle stage and wafer stage are reduced by feeding back the positional deviations to the servo control system during scanning exposure. However, since there is a limit in improving the response speed of this type of feedback system operating in response to the positional deviation amount, some follow-up errors (positional deviation) remain.

More specifically, even if the scanning directions of the wafer stage and the reticle stage are designed to be parallel to each other, some angular errors may exist between these scanning directions due to mechanical assembly errors, or the like. When such angular errors exist, a positional deviation of the reticle stage relative to the wafer stage is generated in the non-scanning direction during scanning exposure. Using feedback control, a force is generated to correct this positional deviation. Nevertheless, since there is a limit in the response speed of the feedback system, a certain degree of follow-up error will always exist in the non-scanning direction.

One way to reduce the follow-up errors of this type is to increase the gain of the feedback system. However, if the gain of the feedback system is increased, mechanical resonance can be easily excited in the stage system, and accordingly the stage system may vibrate during the scanning exposure.

SUMMARY OF THE INVENTION

Accordingly, the present invention is directed to a scanning exposure apparatus and method that substantially obviates the problems due to limitations and disadvantages of the related art.

An object of the present invention is to provide a scanning type exposure apparatus and method capable of reducing the amount of positional deviation between the reticle and wafer without exciting mechanical resonance or the like during scanning exposure.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a scanning exposure apparatus for scan-exposing the image of a mask pattern on a mask onto a substrate by synchronously moving the mask and the substrate with respect to an exposing radiation flux, the scanning exposure apparatus including a movable mask stage for holding the mask; a movable substrate stage for holding the substrate; a calculation control unit generating control information for maintaining a predetermined positional relationship between the mask stage and the substrate stage during scan-exposure; and an error correction unit adding correction information to the control information generated by the calculation control unit, the correction information being determined in accordance with a predetermined positional error between the mask stage and the substrate stage measured in advance of scan-exposure.

In another aspect, the present invention provides a scanning exposure apparatus for scan-exposing the image of a mask pattern on a mask onto a substrate by synchronously moving the mask and the substrate with respect to an exposing radiation flux, the scanning exposure apparatus including a movable mask stage for holding the mask; a movable substrate stage for holding the substrate; a first detector outputting a first signal indicating the position of the substrate stage; a second detector outputting a second signal indicating the position of the mask stage; a controller processing the first signal to derive a target position of the mask stage, the controller receiving the second signal to derive a deviation of the mask stage from the target position, the controller further deriving an error anticipation signal in accordance with deviations in mask stage movement measured in advance of scan-exposure; and a mask stage controller for moving the mask stage in accordance with the derived deviation of the mask stage from the target position and the error anticipation signal to maintain the position of the mask stage to the target position.

In another aspect, the present invention provides a scanning exposure apparatus for scan-exposing the image of a mask pattern on a mask onto a substrate by synchronously moving the mask and the substrate with respect to an exposing radiation flux, the scanning exposure apparatus including a movable mask stage for holding the mask; a movable substrate stage for holding the substrate; a first detector outputting a first signal indicating the position of the substrate stage; a second detector outputting a second signal indicating the position of the mask stage; and a mask stage driver processing the first signal to derive a target position of the mask stage, the mask stage driver controlling the movement of the mask stage by feedback control in accordance with the second signal and the derived target position, the mask stage driver further providing an error anticipation signal indicating an expected deviation in mask stage movement to the feedback control of the mask stage to perform feedforward control to maintain the position of the mask stage to the target position, the expected deviation being determined in advance of the actual control of the mask stage movement.

In another aspect, the present invention provides a control device for controlling scanning movement of a first movable stage relative to a second movable stage, the control device including a first detector outputting a first signal indicating the position of the first stage; a second detector outputting a second signal indicating the position of the second stage; and a first stage controller processing the second signal to derive a target position of the first stage, the first stage controller controlling the movement of the first stage by feedback control in accordance with the first signal and the derived target position, the first stage controller further providing an error anticipation signal indicating an expected deviation in first stage movement to the feedback control of the first stage to perform feedforward control to maintain the position of the first stage to the target position, the expected deviation being determined in advance of the actual control of the first stage movement.

In a further aspect, the present invention provides a method of controlling scanning movement of a mask stage relative to a substrate stage in a scanning exposure apparatus, the method comprising the steps of deriving an error anticipation signal indicating the tendency in deviation of the mask stage during the scanning movement of the mask stage relative to the substrate stage in advance of actual scanning movement; moving the substrate stage in a predetermined direction; outputting a first signal indicating the position of the substrate stage during the step of moving the substrate stage; moving the mask stage in a predetermined direction substantially in synchronization with the substrate stage movement; outputting a second signal indicating the position of the mask stage during the step of moving the mask stage; processing the first signal to derive a target position of the mask stage during the step of moving the mask stage; processing the second signal in accordance with the target position of the mask stage to derive a deviation of the mask stage from the target position during the step of moving the mask stage; and adjusting the position of the mask stage in accordance with the derived deviation of the mask stage from the target position and the error anticipation signal determined in the step of deriving to maintain the position of the mask stage to the target position during the step of moving the mask stage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
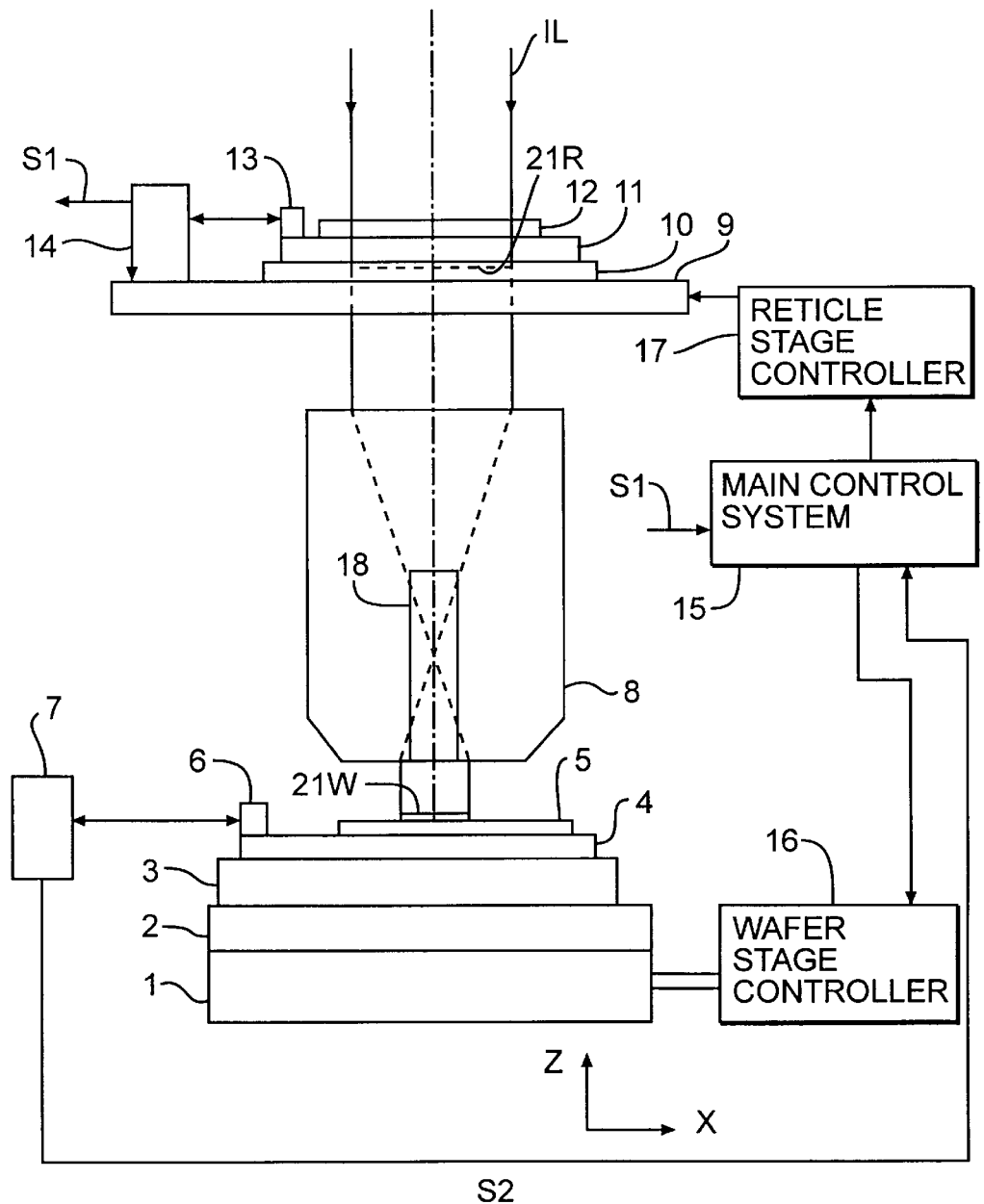
FIG. 1 is a front view schematically showing the stage mechanism of a scanning exposure apparatus according to a preferred embodiment of the present invention.

FIG. 1 shows a projection exposure apparatus according to a preferred embodiment of the present invention. In this embodiment, the present invention is applied to a step-and-scan type projection exposure apparatus. With a rectangular illumination area 21R (also referred to as "slit-like illumination area") formed by illumination light IL (exposing radiation flux) from an illumination optical system (omitted in the figure), the pattern on the pattern formation surface of a reticle 12 is illuminated. The illuminated pattern 21R is reduced by a magnification factor β (β is, for example, ¼, ⅕, etc.) via a projection optical system 8 and is projected and exposed on the slit-like exposure area 21W on the wafer 5. In the figure, the Z axis is taken in a direction parallel to the optical axis of the projection optical system 8, the X axis is taken parallel to the plane of the sheet of FIG. 1 and perpendicular to the Z axis, and the Y axis is taken perpendicular to the plane of the sheet in FIG. 1. When exposure is performed in a scanning exposure mode, the reticle 12 is moved in the −Y direction (or +Y direction) at a speed $V_R$ with respect to the illumination area 21R and wafer 5 is moved (scanned) in the +Y direction (or −Y direction) at the speed $\beta \cdot V_R$ in synchronization with the reticle movement.

A reticle Y axis driving stage 10, which is driven in the Y direction, is mounted on a reticle support stand 9. A reticle micro-driving stage 11 is mounted on the reticle Y axis driving stage 10. The reticle 12 is held on the reticle micro-driving stage 11 by vacuum suction. The reticle micro-driving stage 11 performs fine positional control of the reticle 12 in the X direction, Y direction, and the rotational direction (θ direction) with high precision. A movable mirror 13 is placed on the reticle micro-driving stage 11, and a reticle side interferometer 14 is placed on a reticle support stand 9 so as to be optically coupled to the movable mirror 13. The position of the reticle micro-driving stage 11 in the X direction, Y direction, and the θ direction is constantly monitored using such an optical measurement system. The position information S1 obtained by the interferometer 14 is supplied to a main control system 15.

A wafer Y axis driving stage 2, which is driven in the Y direction, is mounted on a wafer support stand 1. A wafer X axis driving stage 3, which is driven in the X direction, is mounted on the wafer Y axis driving stage. A Zθ axis driving stage 4 is installed on the wafer X axis driving stage, and the wafer 5 is held by vacuum suction on the Zθ axis driving stage 4. A movable mirror 6 is fixed on the Zθ axis driving stage 4, and a wafer side interferometer 7 is installed to be optically coupled to the movable mirror 6. Accordingly, the position of the Zθ driving stage 4 in the X direction, Y direction, and θ direction is monitored, and the positional information S2 obtained by the interferometer 7 is supplied to the main control system 15. The main control system 15 controls the wafer Y axis driving stage 2, the wafer X axis driving stage 3, and the Zθ axis driving stage 4 via a wafer stage controller 16. The main control system also controls the reticle Y axis driving stage 10 and reticle micro-driving stage 11 via a reticle stage controller 17. The main control system 15 further performs overall control of the exposure apparatus.

A fiducial mark member (not shown in the figures), on which a fiducial mark is formed for use in aligning the reticle 12 with wafer 5, is installed on the Zθ axis driving stage 4, and a reticle alignment microscope (not shown in the figures) for detecting positional deviation amount between the fiducial mark and an alignment mark on the reticle 12 is installed above the reticle 12. Furthermore, an off-axis type alignment sensor 18 for detecting the position of a wafer alignment mark for aligning the wafer 5 is placed on the side face on the Y direction side of the projection optical system 8. The alignment of the reticle 12 and wafer 5 is performed using the fiducial mark member, alignment sensor 18, etc.

Figure 2A:
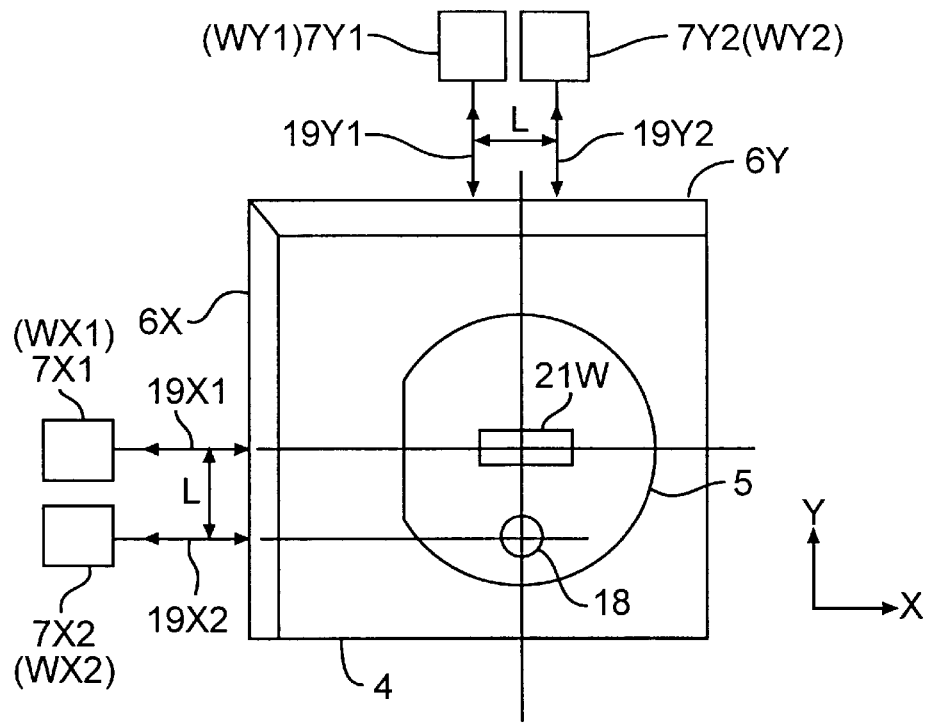
FIG. 2A is a plan view schematically showing the wafer stage configuration of the scanning exposure apparatus of FIG. 1.
Figure 2B:
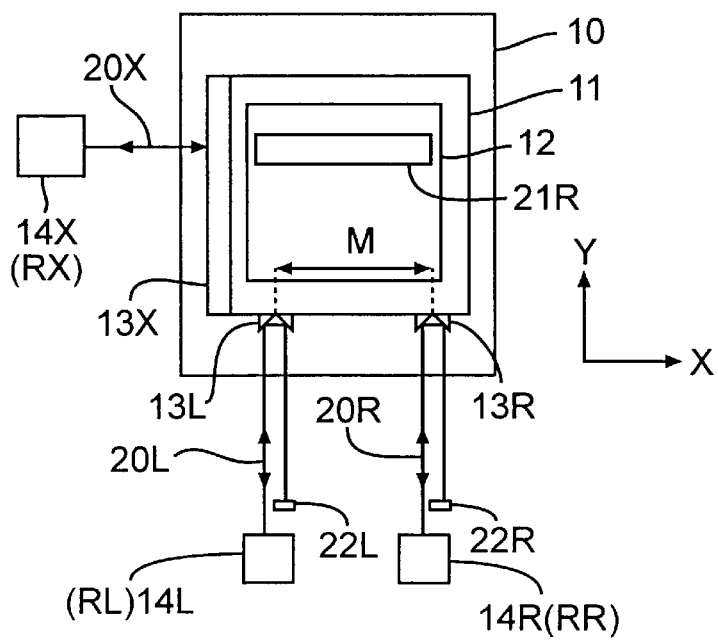
FIG. 2B is a plan view schematically showing the reticle stage configuration of the scanning exposure apparatus of FIG. 1.

Next, the details of the wafer stage and reticle stage are explained referring to FIGS. 2A and 2B. FIG. 2A is a plan view of a wafer stage. In FIG. 2A, the wafer 5 is mounted on the Zθ axis driving stage 4. An X axis movable mirror 6X and Y axis movable mirror 6Y are installed on the Zθ axis driving stage 4. During exposure, the image of the reticle pattern is projected onto the slit-like exposure area 21W on the wafer 5. Also, the Zθ axis driving stage 4 is driven in the Y direction (scanning direction) by a linear motor or the like through the wafer Y axis driving stage 2 in (FIG. 1), and is driven in the X direction by a feed screw or the like through the wafer X axis driving stage 3.

X axis interferometers 7X1, 7X2 project laser beams 19X1 and 19X2 on the movable mirror 6X, along respective optical paths in parallel with the X axis, one of which passes through the optical axis of the projection optical system 8 and the other passes through the optical axis of the alignment sensor 18. These optical paths are separated with interval L. Y axis interferometers 7Y1 and 7Y2 project laser beams 19Y1 and 19Y2 on the movable mirror 6Y along optical paths in parallel with the Y axis. These optical paths are separated with interval L (or L' different from L. In this embodiment, the same interval L is used for simplicity).

In this embodiment, information with the four degrees of freedom, composed of the X direction measurement values WX1, WX2 from the interferometers 7X1, 7X2 and Y direction measurement values WY1, WY2 from the interferometers 7Y1, 7Y2, is used to represent the positional information of the Zθ axis driving stage 4. Accordingly, the rotational angle caused by yawing can also be detected in addition to the position of the Zθ axis driving stage 4 in the X and Y directions. Although the rotational angle can be detected even if one of the interferometers 7X2, 7Y2 is omitted, the precision of detecting the position and yawing can be increased by detecting positional information of four degrees of freedom and by obtaining an averaging effect.

Also, when using the alignment sensor 18 of off-axis type, the position of the Zθ axis driving stage 4 in the X direction is controlled based on the measurement value of the interferometer 7X2 which uses the laser beam 19X2. This way, so-called an Abbe error can be prevented.

FIG. 2B is a plan view of the reticle stage. In FIG. 2B, the reticle micro-movement stage 11 is mounted on the reticle Y axis driving stage 10 and reticle 12 is held on the reticle micro-movement stage 11. Also, a movable mirror 13X for the X direction and two corner cubes 13L and 13R for the Y direction are installed on the reticle micro-movement stage 11. A laser beam 20X is projected from the interferometer 14X onto the movable mirror 13X in parallel with the X axis. Also, laser beams 20L, 20R are projected onto the respective corner cubes 13L, 13R from Y axis interferometers 14L, 14R in parallel with the Y axis. These laser beams are separated with interval M.

Laser beams 20L and 20R reflected from the corner cubes 13L and 13R return to corner cubes 13L and 13R via reflecting mirrors 22L and 22R, respectively, and then return to interferometers 14L and 14R. In other words, the reticle interferometers 14L and 14R are double pass interferometers, and are constructed in such a way as to prevent deviations of the laser beams due to rotation of the reticle micro-movement stage 11. Here, during exposure, the slit-like illumination area 21R on the reticle 12 is illuminated by exposure light at a uniform intensity.

The reticle Y axis movement stage 10 in this example is driven in the Y direction along two driving axes corresponding to the laser beams 20L and 20R by linear motors or the like. The reticle micro-driving stage 11 is driven in the X direction along a driving axis substantially parallel to the laser beam 20X with respect to the reticle Y axis driving stage 10 using an actuator (not shown in the figures). Moreover, by changing the balance of the driving amounts of the linear motors in the Y direction, it is possible to rotate the reticle Y axis driving stage 10 (and thus the reticle fine micro-driving stage 11) within a predetermined angle range. Therefore, the reticle micro-driving stage 11 is driven by a driving system having three degrees of freedom as a whole.

Measurement value RX obtained by the interferometer 14X indicates positional information of the reticle micro-driving stage 11 in the X direction, and measurement values RL, RR at interferometers 14L and 14R indicate positional information of the reticle micro-driving stage 11 in the Y direction along the driving axes of the two linear motors. As seen from FIGS. 1, 2A, and 2B, the reticle side interferometer 14 in FIG. 1 represents three interferometers 14X, 14R, and 14L and the wafer side interferometer 7 represents four interferometers 7X1, 7X2, 7Y1, and 7Y2.

Alternatively, a configuration, in which the reticle fine driving stage 11 is finely movable relative to the reticle Y axis driving stage 10 in three degrees of freedom along driving axes near the laser beams 20L, 20R, and 20X, can be adopted. In this case, the reticle is driven with five degrees of freedom as a whole. By driving two linear motors at a fixed speed in open loop control to drive the reticle Y axis driving stage 10 in the Y direction and by controlling the driving system having three degrees of freedom for the fine adjustment of the reticle micro-driving stage 11 position to correct positional deviations between the reticle 12 and wafer 5, the control system of the above example can be used without modification.

Figure 3:
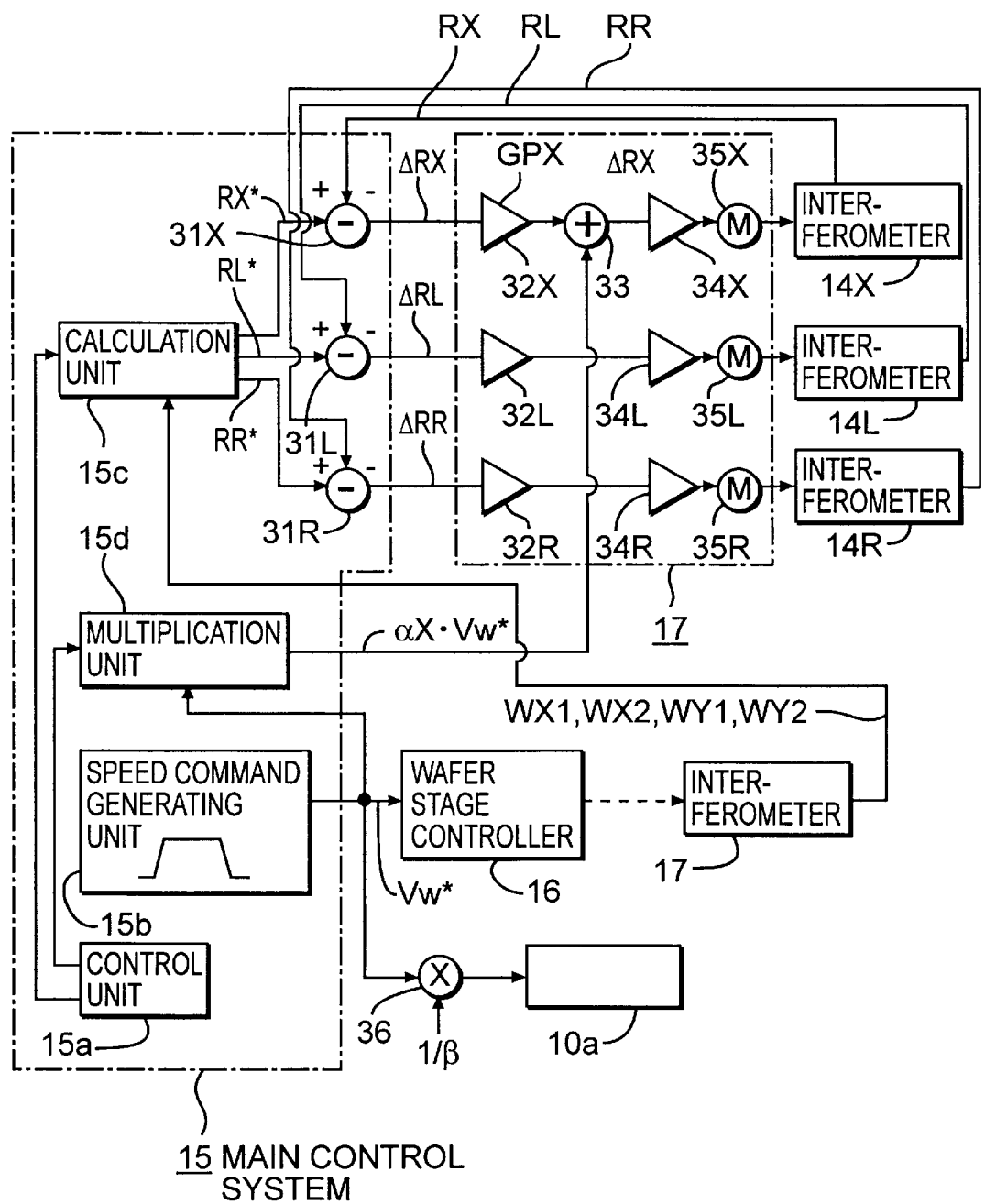
FIG. 3 is a block diagram of the control system of the stage system including a functional block diagram according to the preferred embodiment of the present inventions.

Next, referring to FIG. 3, a synchronized control method of the stage system during the scanning exposure of the projection exposure apparatus according to the present embodiment is explained.

FIG. 3 shows the structure of the control system for the stage system according to the present embodiment. In FIG. 3, it is assumed that initial alignment of the reticle and wafer has been performed and the reticle and wafer have been positioned in their respective scanning starting positions. Then, the control unit 15a in the main control system 15 supplies commands for starting scanning exposure to a speed command generating unit 15b, a calculation unit 15c, and a multiplication unit 15d. A speed command signal indicating an X direction target speed (normally 0) of the wafer side Zθ axis driving stage 4 in FIG. 2 and a Y direction target scanning speed $V_W^*$ are supplied from the speed command generating unit 15b to the wafer stage controller 16 and multiplication unit 15d. The wave form of the target scanning speed $V_W^*$ in the Y direction is a trapezoidal form that gradually increases from 0 to a fixed scanning speed $V_{W0}$ and gradually returns to 0 after a predetermined time internal. Here, the control unit 15a, speed command generating unit 15b, calculation unit 15c, and multiplication unit 15d may be implemented as functions on computer software, for example.

In the multiplication unit 15d, the target scanning speed $V_W^*$ is multiplied by a coefficient αX, which is pre-determined and stored in advance, as will be described below, and the resultant correction speed $αX \cdot V_W^*$ is supplied to one of the input of adder 33 in the reticle stage controller 17. The wafer stage controller 16 drives the wafer Y axis driving stage 2 in the Y direction at the target scanning speed $V_W^*$ by open loop control, and, if necessary, drives the wafer X axis driving stage 3 in the X direction at a predetermined target speed. At this time, the positions WX1, WX2, WY1, WY2 of the Zθ axis driving stage 4, which are measured by interferometers 7X1, 7X2, 7Y1, 7Y2 in FIG. 2A, are supplied to calculation unit 15c at a predetermined sampling frequency. Using interval L between the two laser beams 19X1, 19X2 and interval L between laser beams 19Y1, 19Y2 in FIG. 2, the calculation unit 15c multiplies a vector constructed of the measurement values WX1, WX2, WY1, WY2 by a matrix T1 defined by the following equation (1), and converts the vector to a new vector composed of X direction position WX, Y direction position WY, and rotational angle Wθ of the Zθ axis driving stage 4.

$$\begin{bmatrix} WX \\ WY \\ W\theta \end{bmatrix} = T1 \begin{bmatrix} WX1 \\ WX2 \\ WY1 \\ WY2 \end{bmatrix} = \begin{bmatrix} 1/2 & 1/2 & 0 & 0 \\ 0 & 0 & 1/2 & 1/2 \\ \frac{1}{L \cdot 2} & \frac{-1}{L \cdot 2} & \frac{-1}{L \cdot 2} & \frac{1}{L \cdot 2} \end{bmatrix} \begin{bmatrix} WX1 \\ WX2 \\ WY1 \\ WY2 \end{bmatrix} \quad (1)$$

Next, the calculation unit 15c determines an offset vector B and matrices T3, T2 whose elements includes the relative rotational angle θ of the reticle 12 and wafer 5 determined by initial alignment and projection magnification β. Then, a vector reticle position vector (RX*, RY*, Rθ*) indicating X direction target position RX*, Y direction target position RY*, and target rotational angle Rθ* of the reticle micro-driving stage 11 in FIG. 2B are derived from a vector (WX, WY, Wθ) indicating the position and rotational angle of the Zθ axis driving stage 4, as follows.

$$\begin{bmatrix} RX^* \\ RY^* \\ R\theta^* \end{bmatrix} = T3 \cdot T2 \begin{bmatrix} WX \\ WY \\ W\theta \end{bmatrix} + B \quad (2)$$

$$= \begin{bmatrix} \cos\theta & -\sin\theta & 0 \\ \sin\theta & \cos\theta & 0 \\ 0 & 0 & 1+\theta \end{bmatrix} \begin{bmatrix} 1/\beta & 0 & 0 \\ 0 & 1/\beta & 0 \\ 0 & 0 & 1 \end{bmatrix} \begin{bmatrix} WX \\ WY \\ W\theta \end{bmatrix} + B$$

Furthermore, using matrix T4 including the interval M between laser beams 20L and 20R, the calculation unit 15c converts the target reticle position vector (RX*, RY*, Rθ*) into a vector (RX*, RL*, RR*) indicating the target position in terms of values to be measured along the three driving axes of the reticle micro-driving stage 11, as shown in the following equation (3). In other words, the vector (RX*, RL*, RR*) indicates the target position of the reticle micro-driving stage 11 that are to be measured by the interferometers 14X, 14L, 14R during scanning exposure. The elements of this vector (RX*, RL*, RR*) are supplied to the addition inputs of respective differential units 31X, 31L, 31R (FIG. 3).

$$\begin{bmatrix} RX^* \\ RL^* \\ RR^* \end{bmatrix} = T4 \begin{bmatrix} RX^* \\ RY^* \\ R\theta^* \end{bmatrix} = \begin{bmatrix} 1 & 0 & 0 \\ 0 & 1 & M/2 \\ 0 & 1 & -M/2 \end{bmatrix} \begin{bmatrix} RX^* \\ RY^* \\ R\theta^* \end{bmatrix} \quad (3)$$

Moreover, in FIG. 3, the positions (RX, RL, RR) that have been actually measured by the reticle side interferometers 14X, 14L, 14R are supplied to the substraction input of the differential units 31X, 31L, 31R. In the differential units 31X, 31L, 31R as a whole, the vector (RX, RL, RR) indicating the actual position of the reticle micro-driving stage 11 is subtracted from the vector (RX*, RL*, RR*) indicating the target position of the reticle micro-driving stage 11 to derive an error vector (ΔRX, ΔRL, ΔRR), as shown in the following equation (4). This error vector is expressed in terms of a vector (WX1, WX2, WY1, WY2) indicating the position of the Zθ axis driving stage 4 described above, and the matrices T1–T4, etc., as follows.

$$\begin{bmatrix} \Delta RX \\ \Delta RL \\ \Delta RR \end{bmatrix} = \qquad (4)$$

$$\left\{ \begin{bmatrix} RX^* \\ RY^* \\ RR^* \end{bmatrix} - \begin{bmatrix} RX \\ RL \\ RR \end{bmatrix} = T4 \cdot T3 \cdot T2 \cdot T1 \begin{bmatrix} WX1 \\ WX2 \\ WY1 \\ WY2 \end{bmatrix} + T4 \, B - \begin{bmatrix} RX \\ RL \\ RR \end{bmatrix} \right\}$$

Each element of the error vector (ΔRX, ΔRL, ΔRR) obtained from the differential units 31X, 31L, 31R are supplied (fed back) to the reticle stage controller 17, and accordingly the reticle stage controller 17 controls the position of the reticle micro-driving stage 11 in three degrees of freedom to eliminate the error vector (ΔRX, ΔRL, ΔRR).

Also, in this embodiment, the speed of the drive system of the reticle micro-driving stage 11 is controlled by converting the error vector above into a velocity vector. More specifically, in the reticle stage controller 17, the error vector elements ΔRX, ΔRL, ΔRR are supplied to position gain units 32X, 32L, 32R, and in the position gain units 32X, 32L, 32R, the error vector elements ΔRX, ΔRL, ΔRR are converted into velocity by multiplying by the respective positional gains GPX, GPL, GPR. The speed (or velocity) (GPX·ΔRX) output from the position gain unit 32X is supplied to the remaining input of the adder 33. In the adder 33, the correction speed (αX·$V_W$*) from the multiplication unit 15d and this speed (GPX·ΔRX) are added and the resultant speed is supplied to a speed gain unit 34X. The speed supplied to this speed gain unit 34X is converted to a driving power in the speed gain unit 34X, and a motor 35X of the actuator for the X direction is driven at this drive power. Thus, the position of the reticle micro-driving stage 11 in the X direction is finally adjusted. Actually, the measurement value of the speed of the motor 35X is fed back in front of the input of the speed gain unit 34X, but this feedback circuit is not shown in the figure. The same feedback mechanism is used in the other motors 35L, 35R.

The speeds GPL·ΔRL and GPR·ΔRR (not shown in the figure) output from the position gain units 32L and 32R are supplied to the speed gain units 34L, 34R, respectively, and driving powers are output from the speed gain units 34L, 34R to drive linear motors 35L, 35R for driving the reticle Y axis driving stage 10 (and thus the reticle fine driving stage 11) in the Y direction and rotational direction. The position of the reticle micro-driving stage 11, which has been driven by the motor 35X, linear motors 35L, 35R is fed back to the differential units 31X, 31L, 31R as the measurement values of the three interferometers 14X, 14L, 14R. Therefore, the reticle micro-driving stage 11 is driven by closed-loop control. As a result, when the movement direction of the wafer Y axis driving stage 2 and the reticle Y axis driving stage 10 are parallel, the reticle micro-driving stage 11 (and reticle 12) is driven in the −Y direction at the speed $(1/\beta)V_{W0}$ in synchronization with the driving of the Zθ axis drive stage 4 (wafer 5) in the +Y direction at a constant speed $V_{W0}$ in such a way as to maintain the relative rotational angle θ.

However, there are cases in which even if the movement direction of the wafer Y axis driving stage 2 is designed to be parallel to the Y axis, the actual movement direction of the reticle Y axis driving stage 10 is angularly offset with respect to the Y axis due to assembly error, or the like. In such cases, when the error vector is merely fed back, some positional deviations remains due to response delay. In this embodiment, using the multiplication unit 15d and adder 33 in FIG. 3, this positional deviation is corrected by feedforward control.

Figures 4A, 4B:
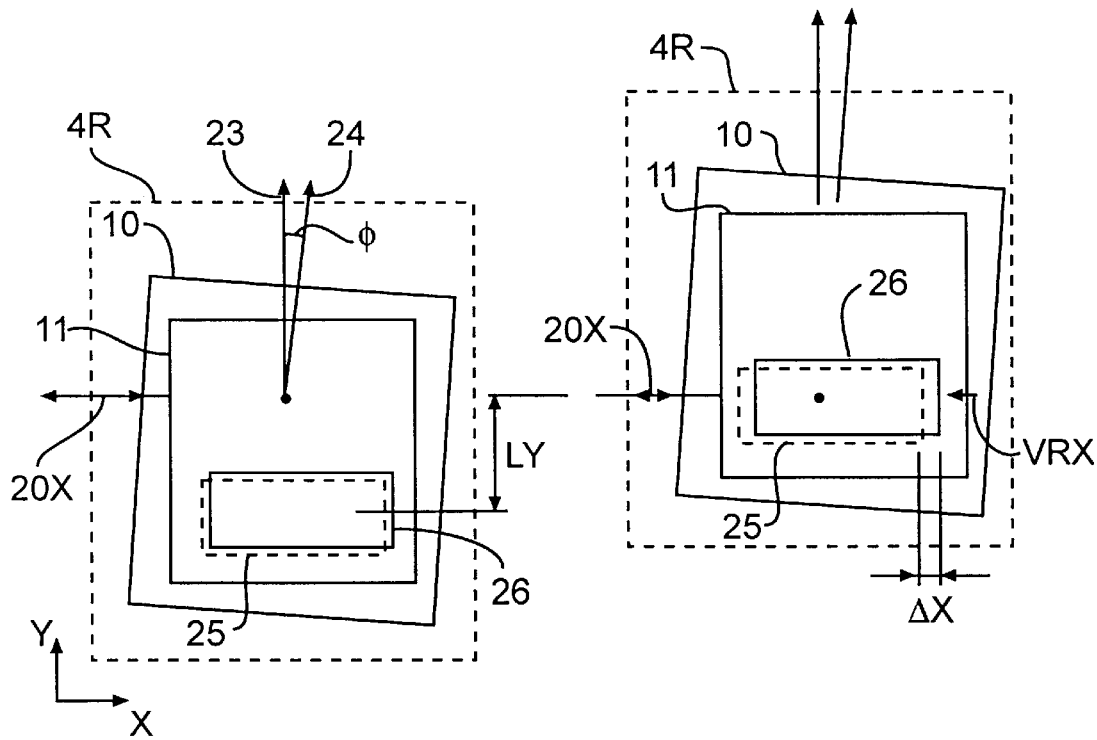
FIGS. 4A and 4B are plan views of the reticle stage used for explaining the positional deviation amount produced when there is an angular deviation φ between the scanning direction of the wafer stage and the scanning direction of the reticle Y-axis driving stage.

FIGS. 4A and 4B is plan views of the reticle stage. The image of the wafer-side Zθ axis driving stage 4 projected on the reticle stage is illustrated as projected image 4R by dotted lines. When scanning exposure is performed, the reticle Y axis drive stage 10 is designed to move in the Y direction together with the Y-direction movement of the projected image 4R of the wafer-side Zθ axis driving stage 4. Suppose, however, that the actual movement of the reticle stage is deviated from the +Y direction by a minute angle φ, for example. More specifically, velocity vector 23 of the projection image 4R is directed in the +Y direction, whereas the velocity vector 24 of the reticle Y axis driving stage 10 deviates from the Y-direction by the angle φ. In FIG. 4A, the image 25 of circuit pattern on the wafer projected on the reticle and the pattern 26 on the reticle overlap with each other. FIG. 4B shows a state in which the reticle micro-driving stage 11 is moved by a distance approximately equal to LY in the direction of the velocity vector 24 from the state of FIG. 4A. At the same time, the projected image 4R moves in the +Y direction by approximately LY. FIG. 4B shows a case where the positional adjustment of the reticle micro-driving stage 11 in the X direction is not performed, or in other words, the feedback of the element ΔRX of the error vector in FIG. 3 and the feedforward of the correction speed αX·$V_W$* are not performed. As a result, a positional deviation in the X direction in the amount of approximately LY·sin φ (assumed to equal ΔX) is generated between the projected image 25 of the circuit pattern on the wafer and the pattern 26 on the reticle in FIG. 4B.

Now, assuming that the reflecting surface of the moveable mirror 13X (see FIG. 2B) on the reticle micro-driving stage 11 is parallel to the Y axis, the position RX of the reticle micro-driving stage 11 measured via the laser beam 20X changes by an amount equal to this positional deviation ΔX. If only feedback control of the element ΔRX of the error vector in FIG. 3 is performed, a drive force indicated by velocity vector VRX is applied to the reticle micro-driving stage 11, as shown in FIG. 4B, and the reticle micro-driving stage 11 is gradually moved in the −X direction to offset the positional deviation in the X direction caused by the angle of inclination φ.

Figures 5A, 5B:
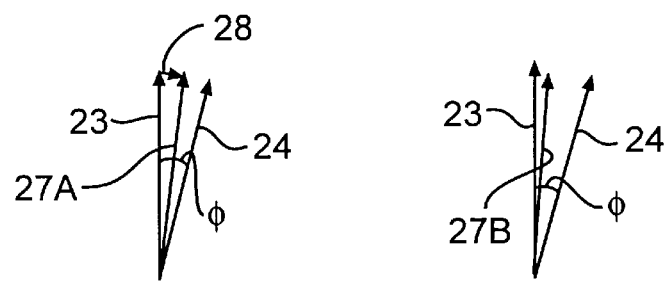
FIG. 5A is a diagram showing the construction of velocity vector 27A of the reticle micro-driving stage 11 when only feedback control is employed.
FIG. 5B is a diagram showing the construction of velocity vector 27B of the reticle micro-driving stage 11 when feed-forward control is implemented in addition to the feedback control.

However, since there is a limit to the follow-up speed (or response speed) of feedback control in general, the resultant velocity vector 27a of the reticle micro-driving stage 11 becomes a vector positioned between the velocity vector 23 of the projected image 4R and the velocity vector 24 of the reticle Y axis driving stage 10. Thus, a directional deviation indicated by error vector 28 still remains, as shown in FIG. 5A. In the present embodiment, in order to reduce this error vector 28, a correction velocity corresponding to the angle of inclination φ is supplied to the adder 33 (FIG. 3) in a feed-forward scheme. Suppose that the actual scanning speed of the wafer-side Zθ axis driving stage 4 is the target scanning speed $V_W$* and the projection magnification ratio (reduction ratio) of the projection optical system 8 is β. Then, the scanning speed of the reticle micro-driving stage 11 becomes about $V_W$*/β. Since the position of the reticle micro-driving stage 11 deviates in the +X direction by an amount sin φ·$V_W$*/β per unit time, the reticle micro-driving stage 11 needs to be driven in advance at a rate of −sin φ·$V_W$*/β in the +X direction to correct this deviation. Consequently, the coefficient αX, by which the target scanning speed $V_W$* is multiplied at the multiplication unit 15d in FIG. 3, becomes as follows;

$$\alpha X = -\sin \phi / \beta. \quad (5)$$

Using this coefficient αX and by supplying the correction speed $\alpha X \cdot V_W^*$ (or error anticipation signal) calculated at the multiplication unit 15d to the adder 33 in a feed-forward mode, the reticle micro-driving stage 11 is driven in the −X direction to offset the positional deviation amount resulting from the angle of inclination φ. As a result, as shown in FIG. 5B, the actual velocity vector 27B of the reticle micro-driving stage 11 becomes approximately equal to the speed vector 23 of the projected image 4R of the wafer-side Zθ axis driving stage 4, and the synchronized scanning with the reticle 12 and wafer 5 aligned can be performed with a high degree of precision. Also, since there is no need to increase gains in the position gain units 32X, 32L, 32R in the closed loop of FIG. 3, mechanical resonance is not induced in the stage system and vibration during scanning exposure can be prevented.

Also, in the present embodiment, since the operation of the reticle micro-driving stage 11 is controlled by adding a correction velocity in a feed-forward mode, only a constant correction speed $\alpha X \cdot V_W^*$ needs to be added to correct the angle of inclination in the direction of movement of the reticle Y axis driving stage 10, thereby simplifying the overall control.

In the embodiment above, in order to correct the angular deviation between the scanning direction of the wafer stage and the scanning direction of the reticle Y axis driving stage 10, a correction speed is provided only to the motor 35X for driving the reticle micro driving stage 11 in the X direction in a feedforward mode. However, if yawing occurs in a predetermined position during the movement of the reticle Y axis driving stage 10 in the Y direction, for example, correction speeds (or error anticipation signal in general) for correcting this yawing may be added in a feedforward mode to the linear motors 35L, 35R for driving the reticle Y axis driving stage 10 in the Y direction. For this purpose, adders may be inserted in front of the speed gain units 34L and 34R in FIG. 3 and the correction speeds obtained at calculation units can be provided to these adders.

Also, in the configuration shown in FIG. 3, the correction speed is added in a feedforward mode. Alternatively, a correction position may be added to the elements of the error vector (ΔRX, ΔRL, ΔRR) in a feedforward mode to correct the positional deviation.

Furthermore, as described above, when the reticle Y axis driving stage 10 is driven by open control at a constant speed, positional deviations may be corrected by driving the reticle micro-driving stage 11. In this case, as shown in FIG. 3, the reticle-side target scanning speed $V_W^*/\beta$ is calculated by the multiplication unit 36 using the target scanning speed $V_W^*$ output from the speed command generating unit 15b, and driving unit 10a drives the reticle Y axis driving stage 10 at the target scanning speed $V_W^*/\beta$. Alternatively, the wafer stage controller 16 may also be controlled in terms of position.

In the configuration shown in FIG. 1, the reticle 12 is mounted over the reticle Y axis driving stage 10 via the reticle micro-driving stage 11. In an alternative configuration, the reticle fine driving stage 11 can be omitted and a micro-movement stage for finely changing the position of the wafer 5 can be installed between the wafer Y axis driving stage 2 and wafer 5 to adjust position of wafer 5 in the Y direction at two positions separated by a predetermined interval in the X direction. In this case, the reticle Y axis driving stage 10 can be controlled by open loop control, and the wafer-side wafer Y axis driving stage 2, the micro-movement stage, etc., may be controlled by closed loop control in accordance with the target position of the wafer stage calculated from the measured position of the reticle Y axis driving stage 10.

Furthermore, in the embodiment above, the position of the wafer stage is measured with four degrees of freedom, and the position of the reticle stage is measured with three degrees of freedom (FIGS. 2A, 2B). However, the positions of the wafer-side stage and the reticle-side stage may both be measured with three degrees of freedom. Alternatively, the position of the wafer-side stage may be measured with three degrees of freedom and the position of the reticle-side stage may be measured with four degrees of freedom, or the positions of the wafer and reticle stages may both be measured with four or more degrees of freedom. As the degree of freedom of measurement increases in this way, the measurement precision of the position and rotational angle increases by taking an average.

According to the scanning type exposure apparatus of the present invention, since an error correction unit adds correction information (or error anticipation signal) for correcting an expected error in the positional relation between the mask stage and the substrate stage to the control information generated by a calculation control unit, this expected error in the positional relation can be corrected in a feed-forward mode. Accordingly, there is no need to increase the feedback gain when performing control by feeding back control information produced by this calculation control unit, and the amount of positional deviation between the mask and the substrate can be reduced without inducing undesirable mechanical resonance, etc.

Also, when the expected positional error occurs due to mechanical assembly errors, this type of positional error can be measured accurately and is easily controllable. Accordingly, this positional error can be corrected reliably in a feedforward scheme.

Furthermore, suppose that either one of the mask stage or the substrate stage is composed of a coarse movement stage for scanning and a micro-movement stage for fine positional correction, and the expected error in positional relation corresponds to an angular error in the movement direction of the coarse movement stage. Then, the calculation control unit may generate speed information of the fine movement stage as the control information (or error anticipation signal), and the error correction unit may add correction speed information for correcting the angular error of the coarse movement stage to the speed information of the fine movement stage generated by the calculation control unit. In this case, this invention has an advantage in that the positional deviation caused by this angle error can be corrected merely by adding a constant correction speed in a feedforward scheme.

According to the present embodiment, as shown in FIG. 2, for example, the position and rotational angle of the mask stage (9–11) are expressed by positions RR, RL in the scanning direction at two measurement points arranged at a specified interval in the non-scanning direction and the position RX in the non-scanning direction. The position and rotational angle of the substrate stage (1–4) are expressed by the positions WY1, WY2 in the scanning direction at two measurement points and the position WX1, WX2 in the non-scanning direction at two measurement points. The positions RR, RL, RX, WY1, WY2, WX1, WX2 are measured with high accuracy using laser interferometers, for example.

The initial positional relation between mask stage and the substrate stage is obtained when the alignment of the mask (12) and substrate (5) is performed before scanning exposure. Once scanning starts, the target position (RR*, RL*, RX*) of the mask stage (9–11) is obtained by performing predetermined calculations on the position (WY1, WY2, WX1, WX2) of the substrate stage (1–4) at the calculation control unit (15c, 31X, 32X), for example. Furthermore, in the calculation control units (15c, 31X, 32X), the actual position (RR, RL, RX) of the mask stage is subtracted from the target position (RR*, RL*, RX*), and the positional deviation amount (ΔRR, ΔRL, ΔRX) is fed back as control information to correct the position of the mask stage to eliminate this positional deviation amount.

Furthermore, in the present invention, a tendency in positional errors between the mask stage and the substrate stage during scan-exposure is measured in advance of actual scanning exposure operation. Then, the error correction unit (15d, 33) calculates the correction information for correcting the error in the positional relation and this correction information is added to the control information generated by the calculation control unit (15c, 31X). Based on this added result, the position of the mask stage is corrected. In other words, the mask stage is driven in a feedforward mode based on the resultant correction information. This way, the error in the positional relation between the mask stage and the substrate stage (the positional deviation amount between the mask 12 and substrate 5) can be reduced without increasing the gain of the feedback system, i.e., without exciting undesirable mechanical resonance, etc., in the system.

One example of the causes for the positional errors is a mechanical assembly error. An example of this type of mechanical assembly errors is a yawing error produced by an angular error between the scanning direction of the mask stage and the scanning direction of the substrate stage. According to the present invention, such consistent mechanical assembly errors can be measured in advance of actual scanning exposure operation with high precision, and thus, can be corrected at high speed by a feedforward control.

Furthermore, when either one of the mask stage or the substrate stage is composed of a coarse movement stage (9, 10) for scanning and a micro-movement stage (11) for fine positional correction and the positional error is an angular error with respect to the movement direction of the coarse movement stage (9, 10), it is desirable that the calculation control unit (15c, 31X, 32X) produces speed information (GPX·ΔRX) of the micro-movement stage (11) as control information and the error correction unit (15d, 33) adds correction speed information (αX·VW) to the speed information (GPX·ΔRX) to correct the angular deviation of the coarse movement stage.

In this case, for example, the coarse movement stage (9, 10) may be driven at a constant speed and the micro-movement stage (11) may be driven to correct the remaining positional deviation. Since the micro-movement stage (11) can be made light in weight, the positional deviation can be corrected at a high response speed.

Furthermore, as shown in FIG. 4, when an angular error φ exists between the scanning direction (23) of the substrate stage (1–4) and the scanning direction (24) of the coarse movement stage (9, 10), the positional deviation in the non-scanning direction between the substrate stage (1–4) and the coarse movement stage (9, 10) gradually increases if there is no correction mechanism. The positional deviation calculated by the calculation control unit (15c, 31X, 32X) also increases. To suppress this positional deviation, micro-movement stage 11 is driven in the non-scanning direction at a speed (GPX·ΔRX) in accordance with the amount of this positional deviation by feedback control. However, a fixed error will always remain due to the limitation of the response speed of feedback control. For this reason, by driving the micro-movement stage (11) in the non-scanning direction in by feedforward control at a speed (αX·VW) in accordance with the angle error φ using the error correction unit (15d, 33), this angle error φ can be corrected almost in real time. Since the micro-movement stage (11) is controlled by speed, the micro-movement stage (11) need only be driven at a constant speed in the non-scanning to correct the angle error φ, thereby providing a simple control scheme.

It will be apparent to those skilled in the art that various modifications and variations can be made in the scanning exposure apparatus and method of the present invention without departing from the spirit or scope of the invention. Thus, it is intended that the present invention cover the modifications and variations of this invention provided they come within the scope of the appended claims and their equivalents.

What is claimed is:

1. A scanning exposure apparatus for scan-exposing the image of a mask pattern on a mask onto a substrate by synchronously moving the mask and the substrate with respect to an exposing radiation flux, the scanning exposure apparatus comprising:

a movable mask stage for holding the mask;

a movable substrate stage for holding the substrate;

a calculation control unit generating control information for maintaining a predetermined positional relationship between the mask stage and the substrate stage during scan-exposure; and an error correction unit adding correction information to the control information generated by the calculation control unit, the correction information being determined in accordance with a predetermined positional error between the mask stage and the substrate stage measured in advance of scan-exposure.

2. The scanning exposure apparatus according to claim 1, wherein said predetermined positional error includes a mechanical assembly error.

3. The scanning exposure apparatus according to claim 2, wherein at least one of the mask stage and the substrate stage includes a coarse movement stage for coarse movement and a micro-movement stage coupled to the coarse movement stage for fine positional correction, wherein the predetermined positional error includes a directional error with respect to the movement direction of the coarse movement stage, wherein the calculation control unit generates the control information including velocity control information of the micro-movement stage, and wherein the error correction unit adds the correction information including velocity correction information to the velocity control information of the micro-movement stage generated by the calculation control unit to offset the directional error of the coarse movement stage.

4. The scanning exposure apparatus according to claim 1, wherein at least one of the mask stage and the substrate stage includes a coarse movement stage for coarse movement and a micro-movement stage coupled to the coarse movement stage for fine positional correction, wherein the predetermined positional error includes a directional error with respect to the movement direction of the coarse movement stage, wherein the calculation control unit generates the control information including velocity control information of the micro-movement stage, and wherein the error correction unit adds the correction information including velocity correction information to the velocity control information of the micro-movement stage generated by the calculation control unit to offset the directional error of the coarse movement stage.

5. A scanning exposure apparatus for scan-exposing the image of a mask pattern on a mask onto a substrate by synchronously moving the mask and the substrate with respect to an exposing radiation flux, the scanning exposure apparatus comprising:

a movable mask stage for holding the mask;

a movable substrate stage for holding the substrate;

a first detector outputting a first signal indicating the position of the substrate stage;

a second detector outputting a second signal indicating the position of the mask stage;

a controller processing the first signal to derive a target position of the mask stage, the controller receiving the second signal to derive a deviation of the mask stage from the target position, the controller further deriving an error anticipation signal in accordance with deviations in mask stage movement measured in advance of scan-exposure; and a mask stage controller for moving the mask stage in accordance with the derived deviation of the mask stage from the target position and the error anticipation signal to maintain the position of the mask stage to the target position.

6. The scanning exposure apparatus according to claim 5, wherein the controller includes:

a calculation unit processing the first signal to derive the target position of the mask stage;

a differential unit receiving the second signal and a signal indicating the target position of the mask stage to derive the deviation of the mask stage from the target position; and a multiplication unit deriving the error anticipation signal in accordance with the deviation in mask stage movement measured in advance of scan-exposure.

7. The scanning exposure apparatus according to claim 5, wherein the controller multiplies a design velocity of the substrate stage by a predetermined coefficient determined in accordance with the deviations in mask stage movement measured in advance of scan-exposure to derive the error anticipation signal in termns of velocity, and wherein the mask stage controller includes:

a position gain unit for multiplying the derived deviation of the mask stage from the target position by a predetermined positional gain to output a velocity signal indicating the deviation of the mask stage in terms of velocity; and an adder adding the velocity signal and the error anticipation signal to derive a target velocity of the mask stage.

8. The scanning exposure apparatus according to claim 5, further comprising a projection optical system for projecting the image of the mask pattern onto the substrate with a predetermined reduction ratio, wherein the controller processes the first signal in accordance with the predetermined reduction ratio to derive the target position of the mask stage.

9. The scanning exposure apparatus according to claim 5, wherein the first detector outputs the first signal including a first vector signal, and the second detector outputs the second signal including a second vector signal, wherein the controller multiplies the first vector signal by a predetermined matrix to derive the target position of the mask stage in terms of a vector, the controller receiving the second vector signal to derive the deviation of the mask stage from the target position in terms of a vector.

10. The scanning exposure apparatus according to claim 5, wherein the first detector includes a mirror fixed to the substrate stage and a laser interferometer optically coupled to the mirror.

11. The scanning exposure apparatus according to claim 5, wherein the second detector includes a mirror fixed to the mask state and a laser interferometer optically coupled to the mirror.

12. A scanning exposure apparatus for scan-exposing the image of a mask pattern on a mask onto a substrate by synchronously moving the mask and the substrate with respect to an exposing radiation flux, the scanning exposure apparatus comprising:

a movable mask stage for holding the mask;

a movable substrate stage for holding the substrate;

a first detector outputting a first signal indicating the position of the substrate stage;

a second detector outputting a second signal indicating the position of the mask stage; and a mask stage driver processing the first signal to derive a target position of the mask stage, the mask stage driver controlling the movement of the mask stage by feedback control in accordance with the second signal and the derived target position, the mask stage driver further providing an error anticipation signal indicating an expected deviation in mask stage movement to the feedback control of the mask stage to perform feedforward control to maintain the position of the mask stage to the target position, the expected deviation being determined in advance of the actual control of the mask stage movement.

13. The scanning exposure apparatus according to claim 12, wherein the mask stage driver includes:

a first controller processing the first signal to derive the target position of the mask stage, the first controller receiving the second signal to derive the deviation of the mask stage from the target position, the first controller further deriving the error anticipation signal in accordance with the expected deviation; and a second controller for moving the mask stage in accordance with the derived deviation of the mask stage from the target position and the error anticipation signal to perform feedback control and feedforward control of the mask stage movement.

14. A control device for controlling scanning movement of a first movable stage relative to a second movable stage, the control device comprising:

a first detector outputting a first signal indicating the position of the first stage;

a second detector outputting a second signal indicating the position of the second stage; and a first stage controller processing the second signal to derive a target position of the first stage, the first stage controller controlling the movement of the first stage by feedback control in accordance with the first signal and the derived target position, the first stage controller further providing an error anticipation signal indicating an expected deviation in first stage movement to the feedback control of the first stage to perform feedforward control to maintain the position of the first stage to the target position, the expected deviation being determined in advance of the actual control of the first stage movement.

15. A method of controlling scanning movement of a mask stage relative to a substrate stage in a scanning exposure apparatus, the method comprising the steps of:

deriving an error anticipation signal indicating the tendency in deviation of the mask stage during the scanning movement of the mask stage relative to the substrate stage in advance of actual scanning movement;

moving the substrate stage in a predetermined direction;

outputting a first signal indicating the position of the substrate stage during the step of moving the substrate stage;

moving the mask stage in a predetermined direction substantially in synchronization with the substrate stage movement;

outputting a second signal indicating the position of the mask stage during the step of moving the mask stage;

processing the first signal to derive a target position of the mask stage during the step of moving the mask stage;

processing the second signal in accordance with the target position of the mask stage to derive a deviation of the mask stage from the target position during the step of moving the mask stage; and adjusting the position of the mask stage in accordance with the derived deviation of the mask stage from the target position and the error anticipation signal determined in the step of deriving to maintain the position of the mask stage to the target position during the step of moving the mask stage.

16. The method according to claim 15, wherein the step of deriving the error anticipation signal includes the step of measuring a mechanical assembly error in at least one of the mask stage and the substrate stage.

17. The method according to claim 15, wherein the step of deriving the error anticipation signal includes the step of determining a directional error in the mask stage movement relative to the substrate stage.

18. A method of exposing the image of a mask pattern on a mask onto a substrate by synchronously moving the mask and the substrate with respect to an exposing radiation flux, the method comprising the steps of:

deriving an error anticipation signal indicating the tendency in deviation of the mask stage during the scanning movement of the mask stage relative to the substrate stage in advance of actual scanning movement;

moving the substrate stage in a predetermined direction;

moving the mask stage in a predetermined direction substantially in synchronization with the substrate stage movement;

outputting a first signal indicating the position of the mask stage during the step of moving the mask stage;

processing a second signal to derive a deviation of the mask stage from a target position during the step of moving the mask stage; and adjusting the position of the mask stage in accordance with the derived deviation of the mask stage from the target position and the error anticipation signal determined in the step of deriving to maintain the position of the mask stage during the step of moving the mask stage.

19. The method according to claim 18, wherein the step of deriving the error anticipation signal includes the step of determining a directional error in the mask stage movement relative to the substrate stage.

* * * * *

UNITED STATES PATENT AND TRADEMARK OFFICE
CERTIFICATE OF CORRECTION

PATENT NO. : 5,877,845
DATED : March 2, 1999
INVENTOR(S) : Susumu MAKINOUCHI

It is certified that error appears in the above-identified patent and that said Letters Patent is hereby corrected as shown below:

On title page, insert item [73] to read as follows:

Assignee: Nikon Corporation, Tokyo, Japan

Signed and Sealed this

Seventh Day of September, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO. : 5,877,845
DATED : March 2, 1999
INVENTOR(S) : Susumu MAKINOUCHI

It is certified that error appears in the above-identified patent and that said Letters Patent is hereby corrected as shown below:

On title page, in item [30] Foreign Application Priority Data, insert the following:

May 28, 1996 [JP] Japan 8-133202

Signed and Sealed this

Eleventh Day of July, 2000

*Attest:*

Q. TODD DICKINSON

*Attesting Officer*     *Director of Patents and Trademarks*